United States Patent [19]

Tezuka et al.

[11] Patent Number: 5,757,807
[45] Date of Patent: May 26, 1998

[54] METHOD OF AND APPARATUS FOR EXTRACTING OR INSERTING A SIGNAL IN A TIME DIVISION MULTIPLEX COMMUNICATION SYSTEM

[75] Inventors: Hiroshi Tezuka; Tetsuyuki Suzaki, both of Tokyo, Japan

[73] Assignee: NEC Corporation, Tokyo, Japan

[21] Appl. No.: 523,223

[22] Filed: Sep. 5, 1995

[30] Foreign Application Priority Data

Sep. 27, 1994 [JP] Japan .................. 6-231753
Sep. 28, 1994 [JP] Japan .................. 6-232921

[51] Int. Cl.$^6$ ........................................... H04J 3/04
[52] U.S. Cl. ................. 370/541; 370/484; 370/498; 375/371
[58] Field of Search .................. 370/538, 539, 370/540, 541, 542, 545, 536, 535, 527, 484, 498; 375/371, 373, 372, 333, 365

[56] References Cited

U.S. PATENT DOCUMENTS

| | | | |
|---|---|---|---|
| 4,317,179 | 2/1982 | Kato et al. | 364/515 |
| 4,317,221 | 2/1982 | Toya | 375/365 |
| 4,845,436 | 7/1989 | Kobayashi et al. | 370/484 |
| 4,845,437 | 7/1989 | Mansur et al. | 375/371 |
| 5,034,967 | 7/1991 | Cox et al. | 375/373 |
| 5,301,196 | 4/1994 | Ewen et al. | 375/373 |
| 5,311,559 | 5/1994 | Yasuda | 375/333 |
| 5,367,545 | 11/1994 | Yamashita et al. | 375/372 |
| 5,412,698 | 5/1995 | VanBrunt et al. | 375/373 |
| 5,430,733 | 7/1995 | Takasaki | 370/527 |

FOREIGN PATENT DOCUMENTS

| | | | |
|---|---|---|---|
| A10638874 | 2/1995 | European Pat. Off. | G06T 5/40 |
| 70135/90 | 3/1990 | Japan | H04J 3/04 |

OTHER PUBLICATIONS

Systems and Computers in Japan, vol. 24, No. 11, 1993, USA, pp. 66–74, XP000447455, Jin H.R. & Kobatake H.: "Extraction of Microcalcifications from Mammograms using Morphological Filter with Multiple Structuring Elements".

Computers and Biomedical Research, vol. 25, No. 3, Jun. 1992, USA, pp. 218–237, XP000574508, Shun Leung NG & Bischof W F: "Automated Detection and Classification of Breast Tumors", p. 225.

"10–Gb/s Silicon Bipolar 8:1 Multiplexer and 1:8 Demultiplexer" by L. Stout on pp. 339–343 of IEEE Journal of Solid–State Circuits, vol. 28, No. 3, 1993.

Primary Examiner—Douglas W. Olms
Assistant Examiner—Shick Hom
Attorney, Agent, or Firm—Laff Whitesel Conte & Saret, Ltd.

[57] ABSTRACT

This invention relates to methods and apparatus for extracting data of a channel from and for inserting low speed input data into a channel of time division bit multiplex. An optical data transmission system is used for distribution of video signals or information services. A variable frequency divider generates a timing signal by frequency dividing a clock signal by N. The resulting timing signal is phase shifted by M clock periods by inserting one cycle of 1/(N+M) frequency dividing in accordance with a synchronous command signal. With the timing signal, data of a channel is extracted from the time division multiplexed data of N channels by an extracting circuit, such as a D-type flip-flop. With a synchronous signal generated from the timing signal having the same pulse width of the multiplexed data, a low speed input data is inserted into a channel of the multiplexed data of N channels by a selector.

6 Claims, 7 Drawing Sheets

METHOD OF AND APPARATUS FOR EXTRACTING OR INSERTING A SIGNAL IN A TIME DIVISION MULTIPLEX COMMUNICATION SYSTEM

BACKGROUND OF THE INVENTION

The present invention relates to a time division multiplex communication system, and more particularly to methods of and apparatus for extracting data of a channel from multiplexed data and for inserting low speed input data into a channel of multiplexed data in a time division bit multiplex communication system.

In an optical data transmission system for distribution of video signals or information services, a large volume of data is transmitted in high speed in a time division bit multiplex communication system. In heretofore known multiplexers or demultiplexers used in these time division bit multiplex communication systems, all signals are multiplexed or demultiplexed.

FIG. 6 shows an example of a demultiplexer circuit of four channels disclosed in a Japanese patent application laid open as a preliminary patent publication No. 70135/'90 and FIG. 7 shows a time chart of signals in the demultiplexer circuit.

D-type flip-flops 52, 53, 54, 55, 67, 68, 69 and 70 compose a demultiplexing circuit 41 which converts high speed serial data of four channels into four channels of low speed parallel data. A clock signal is supplied to a clock input terminal 44, and the high speed serial data is input to a data input terminal 43. The clock signal, which has same clock frequency with the high speed serial data, is sent to C terminals of the D-type flip-flops 52, 53, 54 and 55 through an inverter 37. The D-type flip-flops 52, 53, 54 and 55 compose a shift register of four stages. Each output of $\overline{Q}$ terminals of the D-type flip-flops 52, 53, 54 and 55 is connected to each of D terminals of the D-type flip-flops 67, 68, 69 and 70 respectively.

In a synchronous control circuit 42, a synchronous command signal from a synchronous command input terminal 45 is sent to T terminal of a toggle type flip-flop 59 and the output of Q terminal of the toggle type flip-flop 59 is sent to T terminal of another toggle type flip-flop 60 and to gates 33 and 35 in a switching circuit 40. The output of $\overline{Q}$ terminal of the toggle type flip-flop 59 is sent to gates 32 and 34 of the swiching circuit 40, while the output of Q terminal of the toggle type flip-flop 60 is sent to the gates 34 and 35 and the output of $\overline{Q}$ terminal of the toggle type flip-flop 60 is sent to the gates 32 and 33.

A clock signal shown by 102 in FIG. 7 is supplied to the clock input terminal 44, high-speed serial data shown by 101 in FIG. 7 are supplied to the data input terminal 43 and a synchronous command signal shown by 103 in FIG. 7 is supplied to the synchronous command input terminal 45. The clock signal from the clock input terminal 44 is supplied to T terminal of a toggle type flip-flop 57 for ½ frequency dividing and the output of Q terminal of the toggle type flip-flop 57 (shown by 104 in FIG. 7) is sent to another toggle type flip-flop 58 for further ½ frequency dividing. The output of Q terminal of the toggle type flip-flop 58 (shown by 105 in FIG. 7) is sent for delaying by one clock period to D terminal of a D-type flip-flop 61 which is clocked by the output of $\overline{Q}$ terminal of the toggle type flip-flop 57.

The output of Q terminal of the D-type flip-flop 61 is supplied to the gate 32 and the output of $\overline{Q}$ terminal of the D-type flip-flop 61 is supplied to the gate 33. The output of $\overline{Q}$ terminal of the toggle type flip-flop 58 is supplied to the gate 35 through a gate 31 (the input of the gate 35 is shown by 107 in FIG. 7) and to the gate 34 after inverted by the gate 31 (the input of the gate 34 is shown by 106 in FIG. 7).

Thus, four ¼ frequency clock signals phase-shifted by one clock period from each other are supplied to the gates 32, 33, 34 and 35 respectively.

When the synchronous command signal remains low and outputs of $\overline{Q}$ terminals of the toggle type flip-flop 59 and 60 are both at logic 'ON', the gate 32 is open and the gates 33, 34 and 35 are closed. So, the output of Q terminal of the D-type flip-flop 61 is selected as the output of the switching circuit 40 (shown by 108 in FIG. 7) and supplied to C terminals of the D-type flip-flops 67, 68, 69 and 70. Thus, four channels of low speed parallel data shown by 109, 110, 111 and 112 in FIG. 11 are output from the demultiplexing circuit 41.

When the synchronous command signal is delivered to T terminal of the toggle type flip-flop 59 as shown by 103 in FIG. 7, the outputs of Q terminals of both of the toggle type flip-flops 59 and 60 become at logic 'ON'. So, the gate 35 of the switching circuit 40 becomes open and the signal shown by 107 in FIG. 7 is output through the gate 36 as shown by 108 in FIG. 7 from the switching circuit 40. Thus, the D-type flip-flops 67, 68, 69 and 70 select data of different channels. In the same way, the open gate of the switching circuit 40 is shifted from the gate 35 to the gate 34 or from the gate 34 to the gate 33 by every leading edge of the synchronous command signal and the outputs of the D-type flip-flops 67, 68, 69 and 70 change accordingly.

Thus, four channels of low speed parallel data can be extracted from high speed serial multiplexed data of four channels.

FIG. 8 shows a block diagram of an example of a multiplexer circuit described in "10-Gb/s Silicon Bipolar 8:1 Multiplexer and 1:8 Demultiplexer" by L. Stout on pp. 339–343 of IEEE Journal of Solid-state Circuits, Vol. 28, No. 3, 1993.

In FIG. 8, eight channels of low speed parallel data for 8:1 time division multiplex are input to low speed data input terminals d0, d2, d4, d6, d1, d3, d5 and d7. A clock signal having the same clock frequency with the high speed serial data to be output is supplied from a clock input terminal 77. Signals of ½, ¼ and ⅛ clock frequency of the clock signal are obtained respectively from the outputs of three cascaded ½ frequency dividers 74, 75 and 76.

Each of two 4:1 selector circuits 71 and 72 produces a serialized time division multiplexed data of four channels from four channels of low speed parallel data which is input from the low speed data input terminals d0, d2, d4 and d6 or d1, d3, d5 and d7, making use of the signals of ¼ and ⅛ clock frequency supplied from the ½ frequency dividers 75 and 76. The outputs of the two 4:1 selector circuits 71 and 72 are multiplexed by a 2:1 selector circuit 73 making use of the signal of ½ clock frequency supplied from the ½ frequency divider 74 and time division multiplexed serial data of eight channels is output from the 2:1 selector circuit 73.

Thus, eight channels of low speed parallel data are multiplexed into high speed time division multiplexed serial data of eight channels.

The multiplexer circuit or the demultiplexer circuit of a prior art as described is suitable when data of many channels are to be extracted or inserted as at an exchange station of a communication network.

In a network, however, for distribution of video signals or information services, there are cases where almost every subscriber of the network needs data of only one channel to be extracted or inserted.

When the multiplexer or the demultiplexer circuit of the prior art are used in these case, data of all channels must be converted into low speed parallel data for obtaining data of only one channel, and for inserting data of only one channel, data of all channels must be once demultiplexed and again multiplexed after replacing data of a channel with the data to be inserted.

This requires a large scale circuit, large power consumption and complicated control.

SUMMARY OF THE INVENTION

Therefore, an important object of the present invention is to provide simple methods and simple apparatus for extracting data of a channel from time division bit multiplexed data, and for inserting low speed input data into a channel of time division bit multiplexed data, enabling construction of a communication network with equipment of small scale and economizing power consumption of each terminal of the network.

In order to achieve the object, a variable frequency divider is used in the present invention.

For extracting data of a channel from time division multiplexed data of N channels, the variable frequency divider generates a timing signal which has same phase with data of a channel in the multiplexed data by 1/N frequency dividing a clock signal having same clock frequency with the multiplexed data.

With this timing signal, data of a channel in the multiplexed data are extracted by an extracting circuit as a D-type flip-flop, which sample-holds the multiplexed data at every leading edge of the timing signal.

For extracting data of another channel, a synchronous command signal is delivered for controlling the variable frequency divider to insert one cycle of 1/(N+M) frequency division in cycles of 1/N frequency division. By this insertion of one cycle of 1/(N+M) frequency division, the timing signal is phase shifted by M clock periods, and data of another channel, which is shifted by M bits from the formerly selected channel, are extracted. On condition that N and N+M are relatively prime, data of any channel can be extracted by delivering the synchronous command signal repeatedly.

Thus, a data of a channel can be extracted from time division multiplexed data with a small scale circuit and simple control.

For inserting low speed input data into a channel of time division multiplexed data of N channels, a synchronous signal, which has a same pulse width with the multiplexed data and same phase with the timing signal, is generated from the timing signal which is generated by the variable frequency divider above described.

With this synchronous signal, data of a channel of the multiplexed data is replaced with low speed input data by a selector, which selects the low speed input data when the synchronous signal is at logic 'ON' while selecting multiplexed data when the synchronous signal is at logic 'OFF'. And, similarly as above described, any channel of the multiplexed data can be replaced by delivering the synchronous command signal repeatedly.

Thus, with a small scale circuit and simple control, low speed input data can be inserted into a channel of time division multiplexed data.

BRIEF DESCRIPTION OF THE DRAWINGS

The foregoing and other objects, aspects and advantages of the present invention will become apparent from a consideration of the following description, the appended claims, and the accompanying drawings in which the same numerals indicate the same or the corresponding parts.

DETAILED DESCRIPTION OF THE PREFERRED EMBODIMENTS

Figure 1:
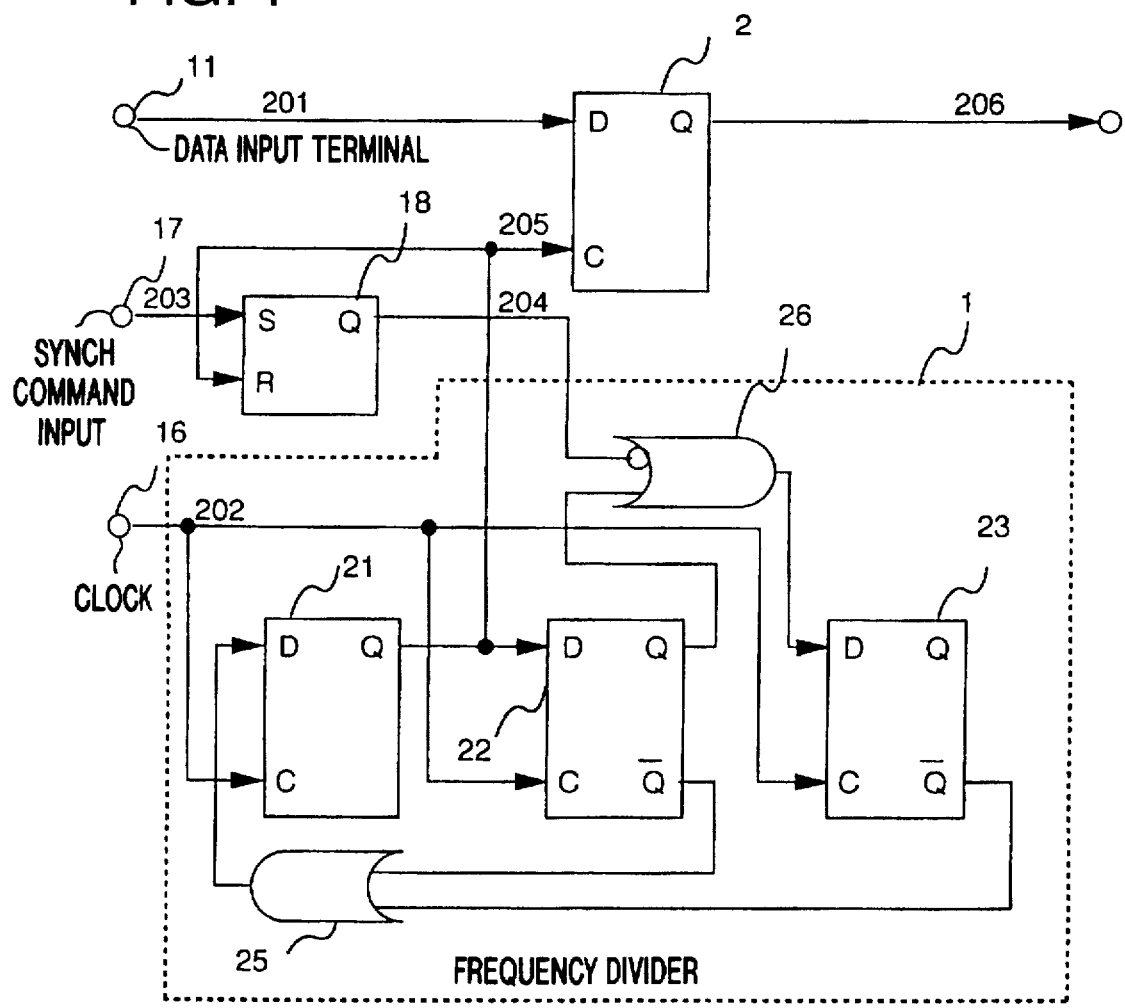
FIG. 1 is a circuit diagram of an apparatus in an embodiment of the present invention for extracting data of a channel from time division multiplexed data of four channels.
Figure 2:
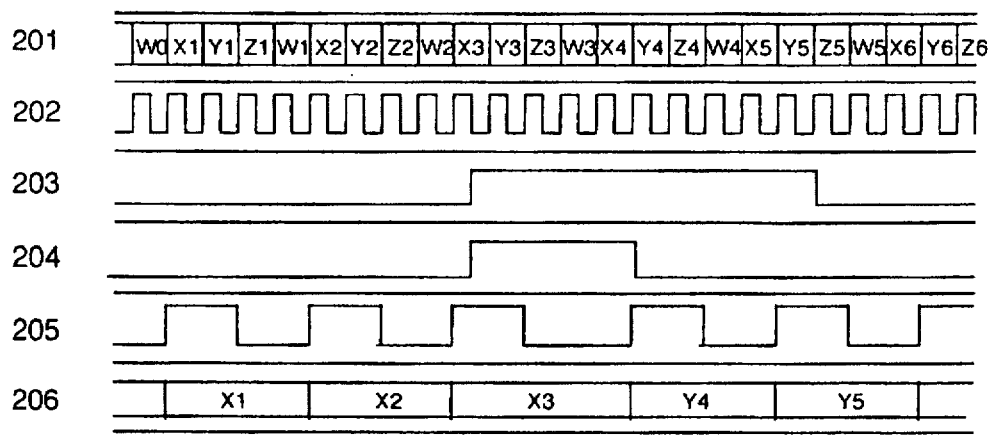
FIG. 2 shows a time chart illustrating the operation of the apparatus shown in FIG. 1.

FIG. 1 is a circuit diagram of an apparatus in an embodiment of this invention for extracting data of a channel from time division multiplexed data, and FIG. 2 shows a time chart illustrating the operation of the apparatus. This apparatus is applied for extracting a data of a channel from time division multiplexed data of four channels, comprising a D-type flip-flop 2 as an extracting circuit, a SR-type flip-flop 18, and a variable frequency divider 1 composed of D-type flip-flops 21, 22 and 23 and OR-gates 25 and 26. In FIG. 2, 201, 202, 203, 204, 205 and 206 indicate multiplexed data of four channels, a clock signal, a synchronous command signal, a control signal, a timing signal and extracted data respectively.

The multiplexed data 201 from data input terminal 11 is supplied to the D (Data) terminal of the D-type flip-flop 2.

The clock signal 202 having same clock frequency with the multiplexed data 201 is supplied from a clock input terminal 16 to C (Clock) terminals of the D-type flip-flops 21, 22 and 23. The output of Q terminal of the D-type flip-flop 21 is connected to D terminal of the D-type flip-flop 22. The output of Q terminal of the D-type flip-flop 22 is connected to an input terminal of the OR-gate 26 and the output of the OR-gate 26 is connected to D terminal of the D-type flip-flop 23. Each output of $\overline{Q}$ terminals of the D-type flip-flops 22 and 23 is connected to each of the two input terminals of the OR-gate 25 and the output of the OR-gate 25 is supplied to D terminal of the D-type flip-flop 21.

The output of Q terminal of the D-type flip-flop 21 is supplied as the timing signal 205 to the C terminal of the D-type flip-flop 2 and R (Reset) terminal of the SR-type flip-flop 18.

The synchronous command signal 203 delivered to a synchronous command input terminal 17 is supplied to S (Set) terminal of the SR-type flip-flop 18 and output of Q terminal of the SR-type flip-flop 18 is supplied as the control signal 204 to an inverted input terminal of the OR-gate 26.

When the synchronous command signal 203 is not delivered, the SR-type flip-flop 18 is reset at each leading edge of the timing signal 205 and the control signal 204 remains at logic 'OFF'. So, the input of D terminal of the D-type flip-flop 23 being at logic 'ON', the output of $\overline{Q}$ terminal of the D-type flip-flop 23 remains at logic 'OFF'. While the output of $\overline{Q}$ terminal of the D-type flip-flop 23 remains at logic 'OFF', D-type flip-flops 21 and 22 compose a ¼ frequency divider and generate the timing signal 205 of ¼ clock frequency as shown by 205 in FIG. 2 from Q terminal of the D-type flip-flop 21. So, the D-type flip-flop 2 extracts data of 'X' series, for example, as shown by 206 in FIG. 2 from the time division multiplexed data 201 of four channels of 'W', 'X', 'Y' and 'Z' series.

When the synchronous command signal 203 is delivered, it triggers-on the SR-type flip-flop 18 and the control signal 204 becomes at logic 'ON'. So, D-type flip-flops 21, 22 and 23 operate as a ⅕ frequency divider. At the end of the first cycle of ⅕ frequency division, the leading edge of the timing signal 205 triggers-off the SR-type flip-flop 18. Thus, one cycle of ⅕ frequency division being inserted in cycles of ¼ frequency division, the phase of the timing signal 205 is shifted by one clock period and the D-type flip-flop 2 becomes to extract data of 'Y' series as shown by 206 in FIG. 2, which are one time slot shifted from the formerly extracted data of 'X' series.

In this way, by repeating to deliver the synchronous command signal, data of any channel can be extracted from time division multiplexed data of four channels.

This method can be applied for time division multiplexed data of any number of channels.

Figure 3:
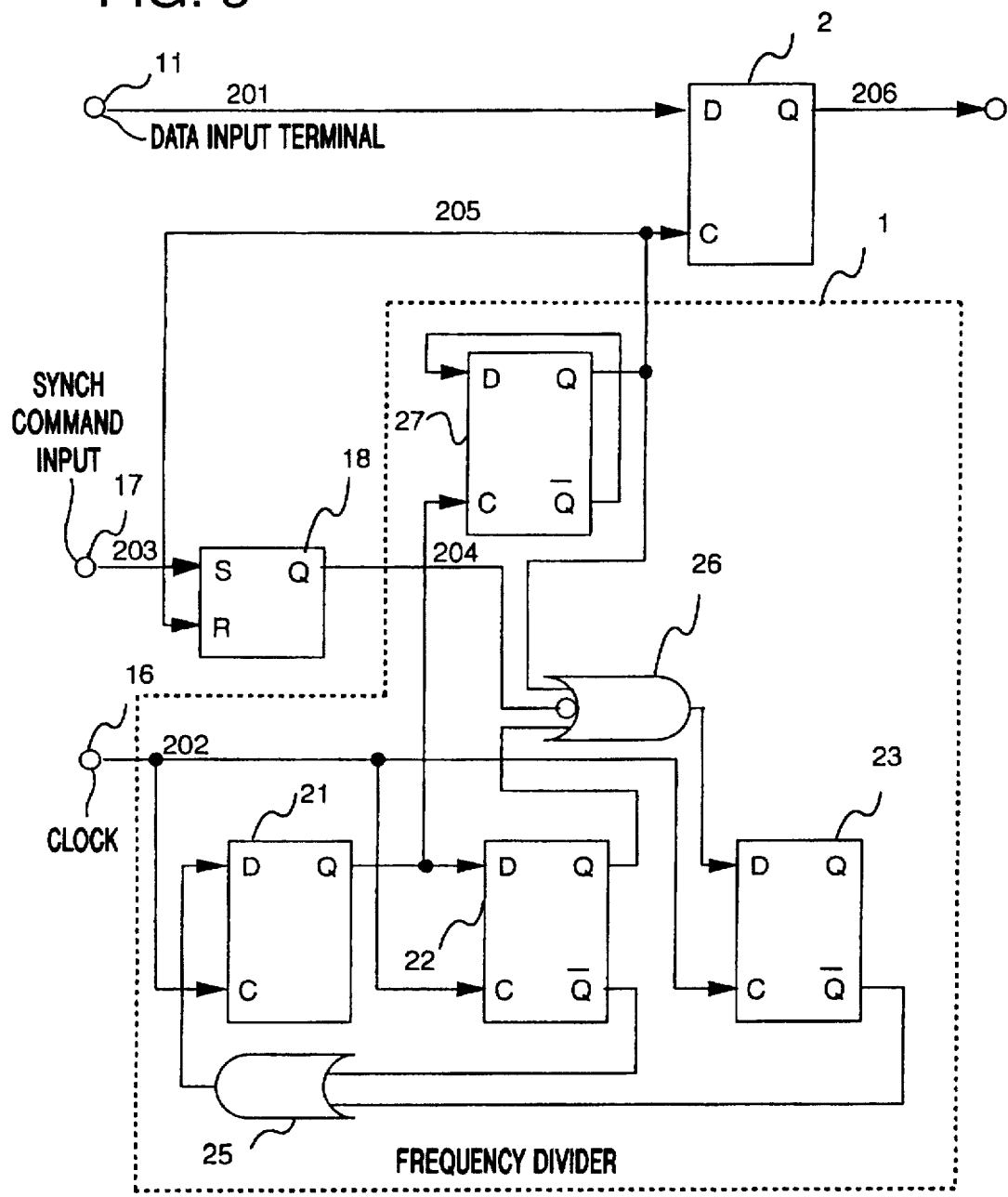
FIG. 3 is a circuit diagram of an apparatus in another embodiment of the present invention for extracting data of a channel from time division multiplexed data of eight channels.

FIG. 3 is a circuit diagram of an apparatus of another embodiment for extracting data of a channel from time division multiplexed data of eight channels.

In this embodiment, the variable frequency divider 1 has a toggle-type flip-flop 27 for further ½ frequency division of the output of Q terminal of the D-type flip-flop 21, and the output of Q terminal of the toggle-type flip-flop 27 is supplied to C terminal of the D-type flip-flop 2 as the timing signal 205, to R terminal of the SR-type flip-flop 18 and to the third input terminal of the OR-gate 26.

When the synchronous command signal 203 is not delivered, the variable frequency divider 1 generates the timing signal 205 of ⅛ clock frequency, and data of a channel are extracted from time division multiplexed data of eight channels. When the synchronous command signal is delivered, the variable frequency divider 1 inserts one cycle of ⅑ clock frequency into the timing signal 205. So, the phase of the timing signal delays one clock period and data of the next channel of the formerly selected channel is extracted. Thus, data of any channel can be extracted from the time division multiplexed data of eight channels.

In these embodiments described, a D-type flip-flop is used as a gate circuit for extracting data of a channel in phase with a timing signal from time division multiplexed data, and a type of a variable frequency divider is described wherein a frequency dividing ratio is changed from ¼ to ⅕ or from ⅛ to ⅑.

But it can be understood that any conventional gate circuit having same function can be used as the extracting circuit, and any conventional variable frequency divider, a two stage phase-lock-loop for example, can be used as the variable frequency divider 1 of this invention. And in FIG. 1 and FIG. 3, the frequency dividing ratio is changed from 1/N to 1/(N+1) for extracting data of a channel from time division multiplexed data of N channels, but it can be changed from 1/N to 1/(N−1), advancing the phase of the timing signal by one clock period.

In a generalized expression, the frequency dividing ratio can be changed from 1/N to 1/(N+M), where M is an integer in a range M>−N and on condition that N and N+M are relatively prime.

Figure 4:
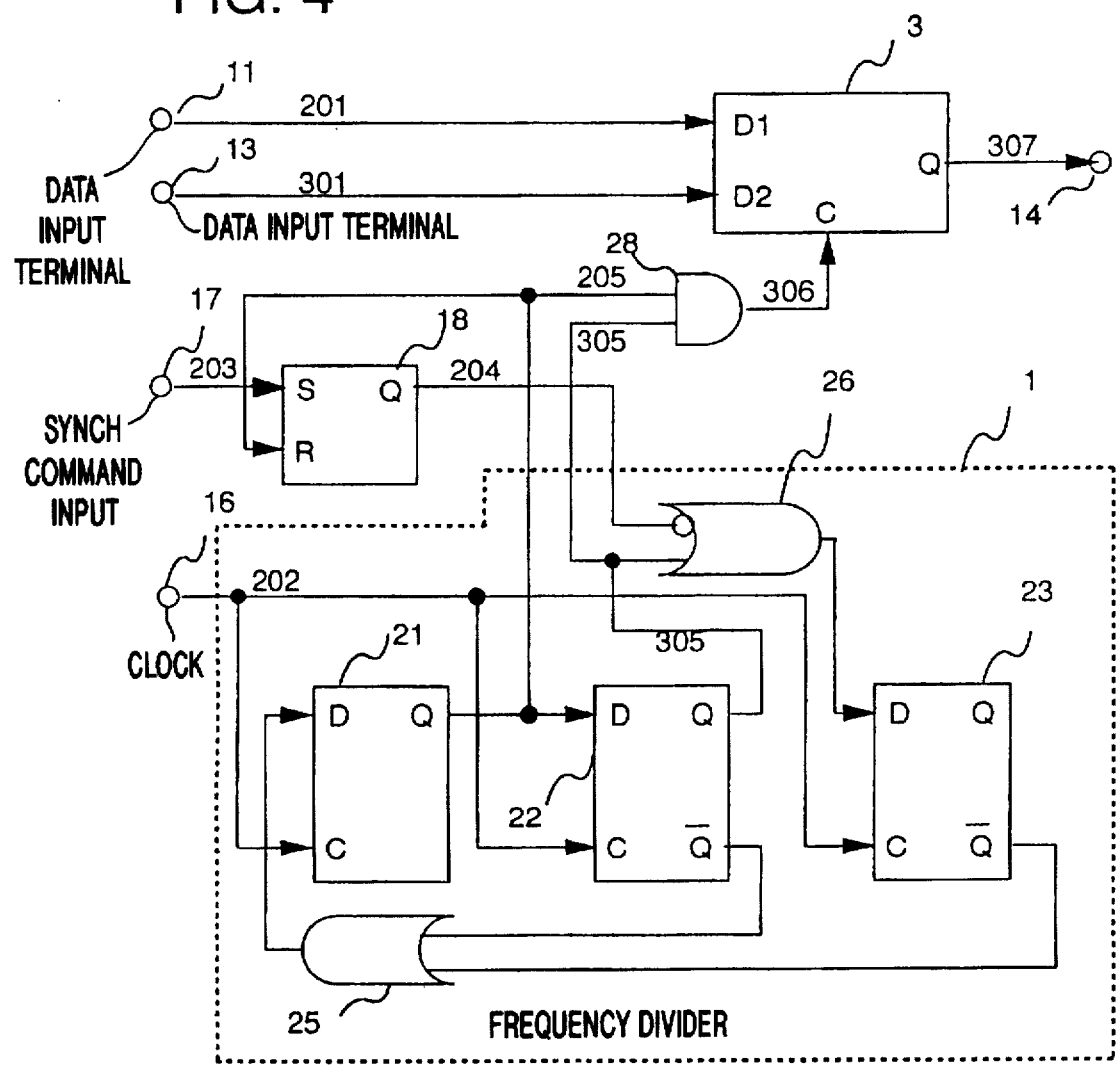
FIG. 4 is a circuit diagram of an apparatus in an embodiment of the present invention for inserting low speed input data into a channel of time division multiplexed data of four channels.
Figure 5:
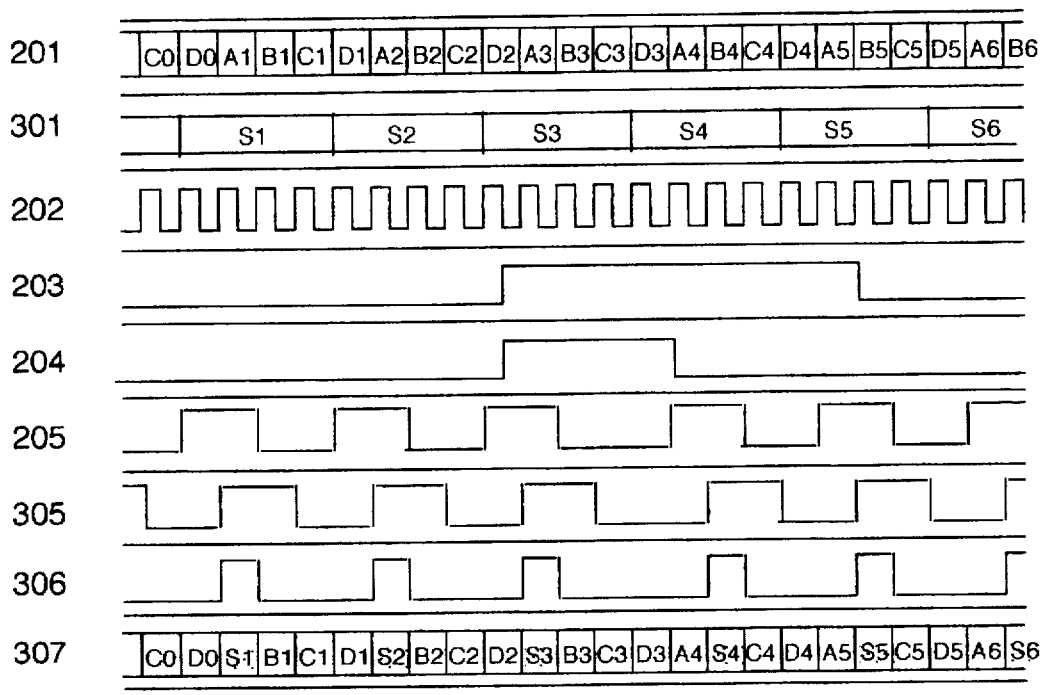
FIG. 5 shows a time chart illustrating the operation of the apparatus shown in FIG. 4.
Figure 6:
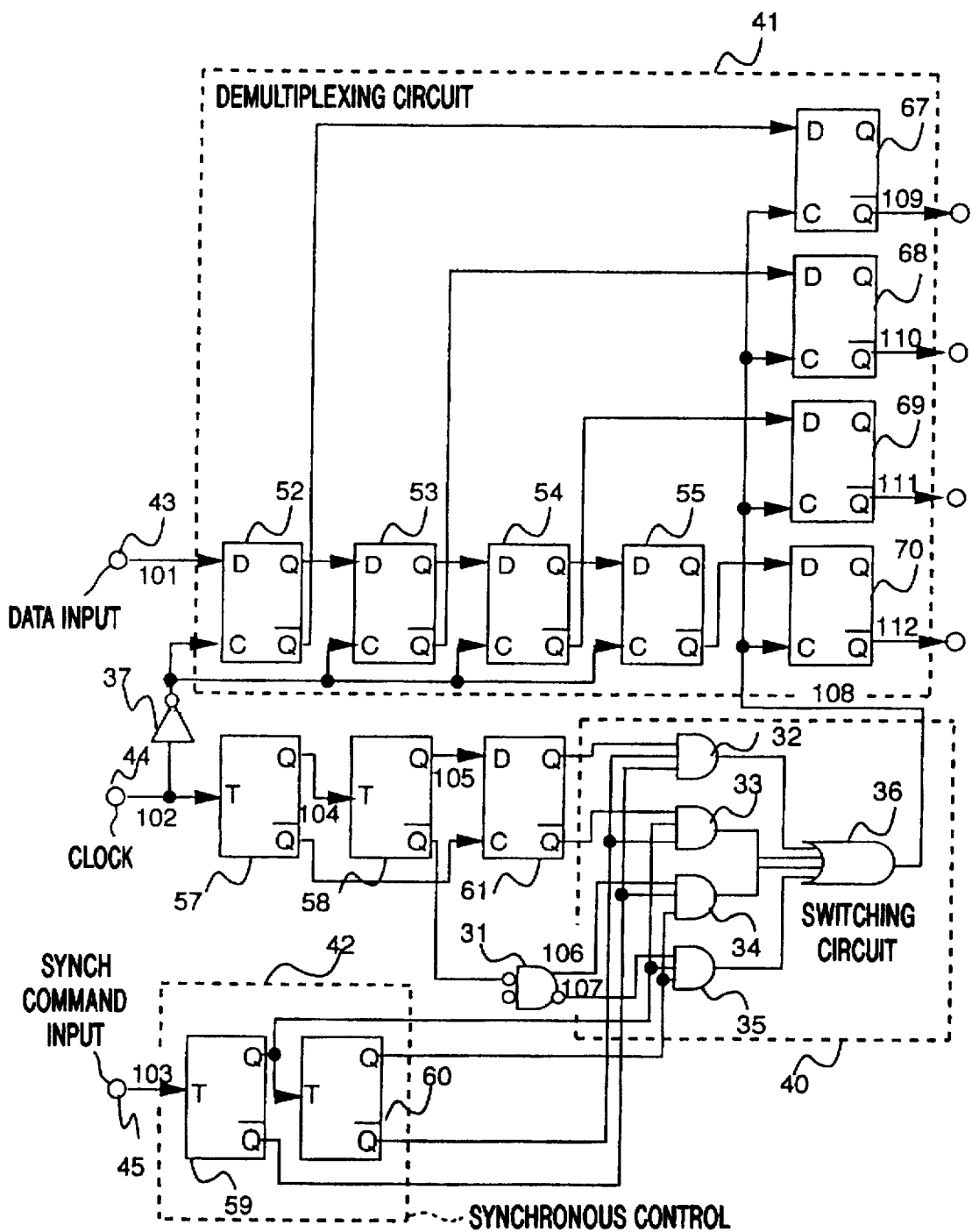
FIG. 6 is a circuit diagram of a demultiplexer circuit of a prior art.
Figure 7:
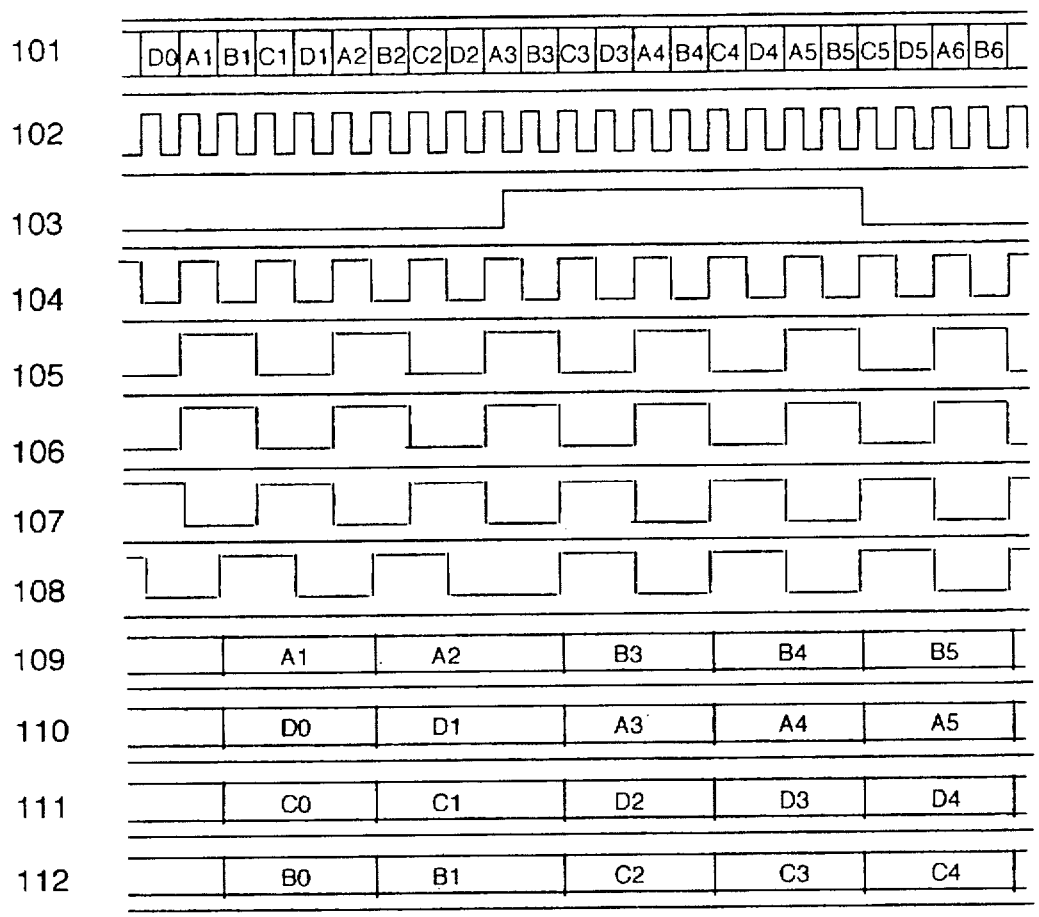
FIG. 7 shows a time chart illustrating the operation of the prior art shown in FIG. 6.
Figure 8:
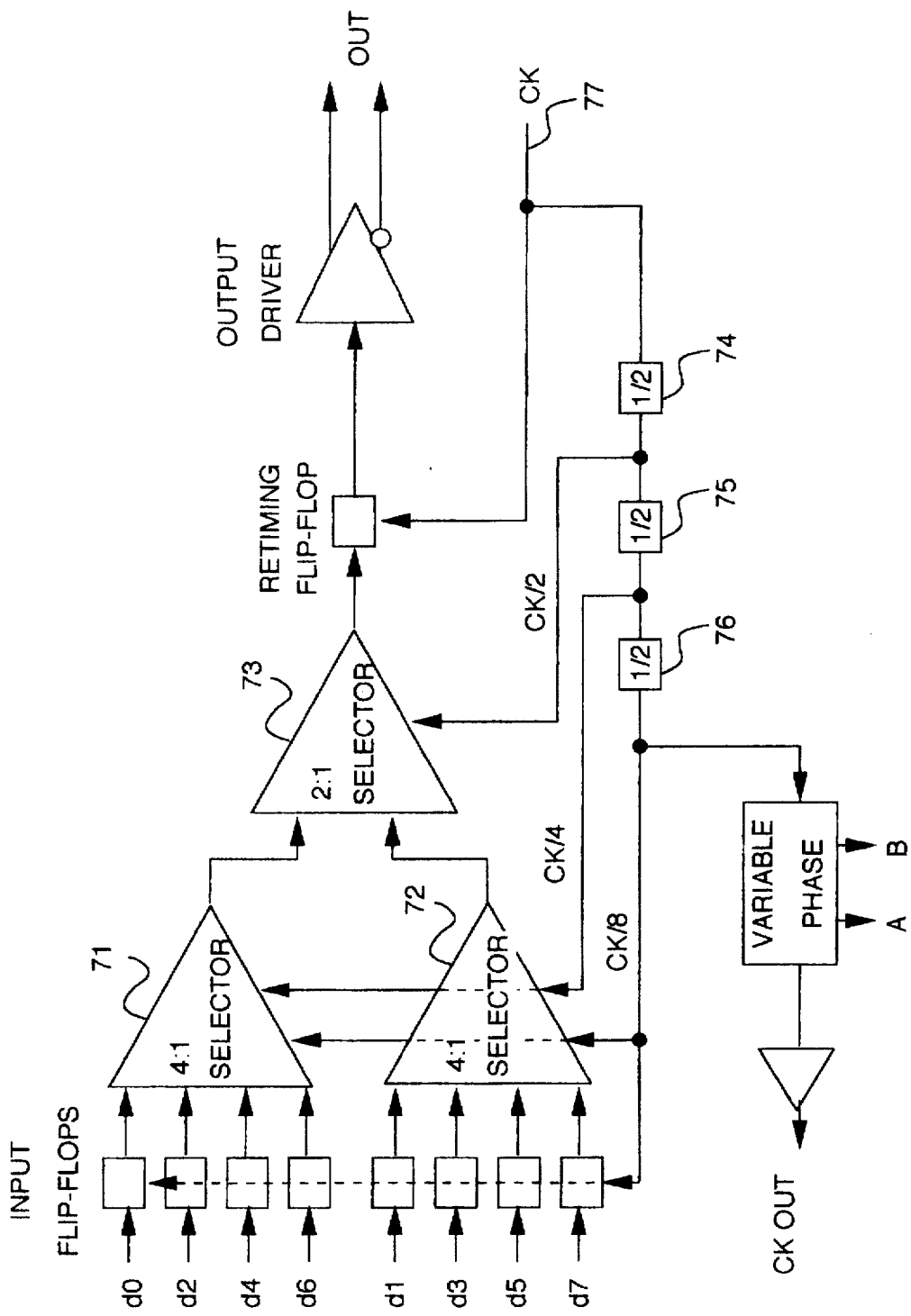
FIG. 8 is a block diagram of a multiplexer circuit of a prior art.

FIG. 4 is a circuit diagram of an apparatus in an embodiment of the present invention for inserting low speed input data into a channel of time division multiplexed data of four channels, and FIG. 5 shows a time chart illustrating the operation of the apparatus.

The apparatus comprises a selector 3, a SR-type flip-flop 18, a variable frequency divider 1 and an AND-gate 28. The variable frequency divider 1 and the SR-type flip-flop 18 in FIG. 4 are the same with those in FIG. 1.

In FIG. 4 the multiplexed data 201 is supplied to D1 terminal of the selector 3 and low speed input data shown by 301 in FIG. 5, which have ¼ clock frequency of the multiplexed data 201, are supplied to D2 terminal of the selector 3.

The timing signal 205, that is the output of Q terminal of the D-type flip-flop 21, and the output of Q terminal of the D-type flip-flop 22 are supplied to each of the two input terminals of the AND-gate 28. As shown by 305 in FIG. 5, the output of Q terminal of the D-type flip-flop 22 is delayed by a clock period from the timing signal 205. So, at the output terminal of the AND-gate 28, a synchronous signal shown by 306 in FIG. 5, which is synchronized to and has a same pulse width with the time division multiplexed data 201, is obtained. This synchronous signal is supplied to C (Clock) terminal of the selector 3.

At the selector 3, the multiplexed data 201 are selected as inserted output data shown by 307 in FIG. 5 when the synchronous signal 306 is at logic 'OFF', and when the synchronous signal is at logic 'ON', the low speed input data 301 is selected as the inserted output data 307. Thus, the inserted output signal 307 is obtained, wherein data of 'A' series in phase with the synchronous signal 306 is replaced with the low speed input data 301 (in an example shown in FIG. 5, data of 'S' series).

When the low speed input data 301 is to be inserted into another channel, the synchronous command signal 203 is delivered to the synchronous command input terminal 17 for triggering-on the control signal 204 in the same way as described in connection with FIGS. 1, 2 and 3. So, one cycle of ⅕ frequency division being inserted to the timing signal 205, the synchronous signal 306 is shifted by one clock period and data of 'B' series becomes replaced with the low speed input data 301 as shown by 307 in FIG. 5.

It goes without saying that any conventional variable frequency divider can be used as the variable frequency divider 1 in FIG. 4 in the same way as the variable frequency divider 1 in FIGS. 1 and 3.

What is claimed is:

1. A method of extracting data of a channel from time division multiplexed data of N channels, comprising:

a step of generating a timing signal by frequency dividing a clock signal having same clock frequency with said time division multiplexed data of N channels by N when a control signal is at logic 'OFF' and by N+M when said control signal is at logic 'ON', where M is an integer in a range M>−N, and N and N+M are relatively prime;

a step of extracting, by said timing signal, data of a first channel which is in phase with said timing signal from said time division multiplexed data of N channels by maintaining said control signal at logic 'OFF';

a step of shifting phase of said timing signal by maintaining said control signal at logic 'ON' for a time to insert one cycle of 1/(N+M) frequency of said clock signal into said timing signal for extracting, by said timing signal, data of a second channel which is shifted by M clock periods from said first channel; and a step of repeating said step of shifting phase of said timing signal for extracting, by said timing signal, data of any channel from said time division multiplexed data of N channels.

2. A method of inserting low speed input data into a channel of time division multiplexed data of N channels which have clock frequency of N times of clock frequency of said low speed input data, comprising:

a step of generating a timing signal by frequency dividing a clock signal having same clock frequency with said time division multiplexed data of N channels by N when a control signal is at logic 'OFF' and by N+M when said control signal is at logic 'ON', where M is an integer in a range M>—N, and N and N+M are relatively prime;

a step of generating, from said timing signal, a synchronous signal which has a same pulse width with said time division multiplexed data of N channels and same phase with said timing signal;

a step of inserting, by said synchronous signal, said low speed input data into a first channel, which is in phase with said synchronous signal, of said time division multiplexed data of N channels by maintaining said control signal at logic 'OFF';

a step of shifting phase of said timing signal by maintaining said control signal at logic 'ON' for a time to insert one cycle of 1/(N+M) frequency of said clock signal into said timing signal for inserting, by said synchronous signal, said low speed input data into a second channel which is shifted by M clock periods from said first channel; and a step of repeating said step of shifting phase of said timing signal for inserting, by said synchronous signal, said low speed input data into any channel of said time division multiplexed data of N channels.

3. An apparatus for extracting data of a channel from time division multiplexed data of N channels, comprising:

a variable frequency divider for generating a timing signal by frequency dividing a clock signal having same clock frequency with said time division multiplexed data of N channels by N when a control signal is at logic 'OFF' and by N+M when said control signal is at logic 'ON', where M is an integer in a range M>—N, and N and N+M are relatively prime;

means for triggering-on said control signal with a leading edge of a synchronous command signal and for triggering-off said control signal with a leading edge of said timing signal; and an extracting circuit for extracting, by said timing signal, data of a channel which is in phase with said timing signal from said time division multiplexed data of N channels.

4. An apparatus of claim 3 for extracting data of a channel from time division multiplexed data of N channels, wherein M=1.

5. An apparatus for inserting low speed input data into a channel of time division multiplexed data of N channels which have clock frequency of N times of clock frequency of said low speed input data, comprising:

a variable frequency divider for generating a timing signal by frequency dividing a clock signal having same clock frequency with said time division multiplexed data of N channels by N when a control signal is at logic 'OFF' and by N+M when said control signal is at logic 'ON', where M is an integer in a range M>—N, and N and N+M are relatively prime;

means for triggering-on said control signal with a leading edge of a synchronous command signal and for triggering-off said control signal with a leading edge of said timing signal;

means for generating, from said timing signal, a synchronous signal which has a same pulse width with said time division multiplexed data of N channels and same phase with said timing signal; and a selector for inserting, by said synchronous signal, said low speed input data into a channel, which is in phase with said synchronous signal, of said time division multiplexed data of N channels.

6. An apparatus of claim 5 for inserting low speed input data into a channel of time division multiplexed data of N channels which have clock frequency of N times of clock frequency of said low speed input data, wherein M=1.

* * * * *